(12) United States Patent
Kim et al.

(10) Patent No.: US 9,763,504 B2
(45) Date of Patent: Sep. 19, 2017

(54) PORTABLE ELECTRONIC DEVICE AND COVER DEVICE THEREOF

(71) Applicant: Samsung Electronics Co., Ltd., Gyeonggi-do (KR)

(72) Inventors: Han Kim, Gyeonggi-do (KR); Won-Kyu Sung, Seoul (KR)

(73) Assignee: Samsung Electronics Co., Ltd (KR)

( * ) Notice: Subject to any disclaimer, the term of this patent is extended or adjusted under 35 U.S.C. 154(b) by 296 days.

(21) Appl. No.: 14/147,090

(22) Filed: Jan. 3, 2014

(65) Prior Publication Data

US 2014/0185206 A1 Jul. 3, 2014

(30) Foreign Application Priority Data

Jan. 3, 2013 (KR) ........................ 10-2013-0000755

(51) Int. Cl.
*A45C 11/00* (2006.01)
*H05K 5/00* (2006.01)
*H05K 5/03* (2006.01)

(52) U.S. Cl.
CPC ............ *A45C 11/00* (2013.01); *H05K 5/0017* (2013.01); *H05K 5/03* (2013.01); *A45C 2011/002* (2013.01); *A45C 2011/003* (2013.01); *A45C 2200/05* (2013.01); *A45C 2200/10* (2013.01)

(58) Field of Classification Search
CPC .............. A45C 11/00; A45C 2011/002; A45C 2011/003; A45C 2200/05; A45C 2200/10; H05K 5/0017; H05K 5/03
See application file for complete search history.

(56) References Cited

U.S. PATENT DOCUMENTS

| 5,644,516 | A | 7/1997 | Podwalny et al. | |
| 9,049,911 | B1 * | 6/2015 | Wood ...................... | A45C 11/00 |
| 9,326,404 | B1 * | 4/2016 | Wood ...................... | G09G 5/003 |
| 2005/0286212 | A1 * | 12/2005 | Brignone .............. | G06F 1/1632 |
| | | | | 361/679.4 |
| 2006/0022954 | A1 | 2/2006 | Berry | |
| 2007/0222765 | A1 * | 9/2007 | Nyyssonen ........... | G06F 1/1607 |
| | | | | 345/173 |
| 2010/0238119 | A1 * | 9/2010 | Dubrovsky ........... | G06F 1/1626 |
| | | | | 345/169 |
| 2014/0030474 | A1 * | 1/2014 | Hsu ........................ | A45C 11/00 |
| | | | | 428/99 |
| 2014/0285961 | A1 * | 9/2014 | Nam ..................... | G06F 1/1616 |
| | | | | 361/679.28 |
| 2014/0328084 | A1 * | 11/2014 | Chuang ................ | H05K 5/0017 |
| | | | | 362/623 |

(Continued)

FOREIGN PATENT DOCUMENTS

| EP | 2175565 | 4/2010 |
| KR | 2020120005719 | 8/2012 |

*Primary Examiner* — Mehmood B Khan
(74) *Attorney, Agent, or Firm* — The Farrell Law Firm, P.C.

(57) ABSTRACT

Disclosed is a cover device for a portable electronic device that includes a cover unit that covers a screen of a display unit of the portable electronic device in such a manner that at least a portion of the screen remains exposed. When the portable electronic device is covered, the cover unit is connected with the portable electronic device such that information displayed on the screen of the display unit is displayed at a position corresponding to the at least a position of the screen that remains exposed.

18 Claims, 8 Drawing Sheets

(56) References Cited

U.S. PATENT DOCUMENTS

| | | | | |
|---|---|---|---|---|
| 2015/0049426 A1* | 2/2015 | Smith | ............... | A45C 11/00 |
| | | | | 361/679.27 |
| 2015/0143648 A1* | 5/2015 | Batey | ............... | A45C 11/00 |
| | | | | 15/104.93 |
| 2015/0160696 A1* | 6/2015 | Lauder | ............... | H01F 7/04 |
| | | | | 361/679.56 |

* cited by examiner

PORTABLE ELECTRONIC DEVICE AND COVER DEVICE THEREOF

PRIORITY

This application claims priority under 35 U.S.C. §119(a) to Korean Application Serial No. 10-2013-0000755, which was filed in the Korean Intellectual Property Office on Jan. 3, 2013, the entire content of which is incorporated herein by reference.

BACKGROUND OF THE INVENTION

1. Field of Invention

The present invention relates generally to a portable electronic device, and more particularly, to a cover device that covers the portable electronic device.

2. Description of Related Art

Recently, portable electronic devices have been widely distributed and used. These devices allow a user access to various types of information. Types of portable electronic devices include portable terminals, MP3 players, Portable Multimedia Players (PMPs), electronic books, etc. Such a portable electronic device, specifically, a portable terminal commonly referred to as a "smart phone," is integrated with various functions such as a photography function, a music play function, a video function, a multimedia function, a game function, a wireless transmitting/receiving function, etc. Such portable terminals are provided with a display device on a front face so that a variety of functions may be accessed. On state-of-the-art portable terminals, the display device is often touch-sensitive and covers the entire front face of the terminal.

However, portable electronic devices and their exterior cases may be subjected to scratches or damage while in the process of being carried or used. In order to avoid such problems, portable electronic devices are provided with various cases or covers (hereinafter, generally referred to as a "cover devices"). The existing cover devices generally either cover only the rear case and the exterior edges of the portable electronic device, leaving exposed the display side so as to allow the display device to be used, or cover the entire portable electronic device through a flip-type cover, where the portion of the cover covering display side of the portable electronic device opens and closes allowing the display device to be used when needed. In the first instance, when the cover device exposing the display device is used, it is difficult to prevent occurrences of scratches or damage on the display device. In the second instance, when the flip-type cover is used, it is inconvenient and inefficient for the user to have to open the cover that covers the display device whenever the user wishes to use the display device. Further, such flip-type covers may be easily damaged as a result of the frequent opening and closing of the cover. Additionally, with both types of covers, the display devices are susceptible to damage such as scratches since the displays are exposed to the outside during use.

SUMMARY

The present invention has been made to address at least the above problems and/or disadvantages and to provide at least the advantages described below. Accordingly, an aspect of the present invention is to provide a portable electronic device, which allows a display device to be seen even when the display device is covered, and enables the display device to be protected, and a cover device of the portable electronic device.

Another aspect of the present invention is to provide a portable electronic device, which allows information displayed on a display device to be seen or enables the display device to be used in a state in which the display device is covered, and a cover device for the portable electronic device.

Still another aspect of the present invention is to provide a portable electronic device, which enables information provided to the display device to be displayed at a position on the display device that is suitable for a cover device that covers the display device, based on the type of the cover device, and a cover device for the portable electronic device.

Yet another aspect of the present invention is to provide a cover device, which prevents the portable electronic device from being damaged by suppressing frequent ON/OFF operations for viewing a screen of a display device in a state where the display device is covered, and a cover device for the portable electronic device.

In accordance with an aspect of the present invention, a cover device for a portable electronic device includes a cover unit that covers a screen of a display unit of the portable electronic device in such a manner that at least a portion of the screen remains exposed. When the portable electronic device is covered, the cover unit is connected with the portable electronic device such that information displayed on the screen of the display unit is displayed at a position corresponding to the at least a position of the screen that remains exposed.

A portable electronic device, according to an aspect of the present invention, includes a body that includes a display unit on a front face, and a connection terminal set on a rear face; a battery cover that covers the rear face of the body; and a front cover part connected to the battery cover to cover the display unit, the front cover part being provided with a screen-viewing part that exposes at least a portion of the screen of the display unit.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF EMBODIMENTS OF THE PRESENT INVENTION

Embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

In the description, the thickness of lines or the size of structural elements in the drawings may be exaggerated and are shown in such manner for convenience and definition of the description only. Further, terms used herein are defined in the context of the functions of the present invention. Furthermore, in the description of the embodiments of the present invention, ordinal numbers such as first and second are used, but are merely used to distinguish objects having the same name. Orders thereof may be arbitrarily determined and the description of a preceding object may be applied to a subsequent object.

Embodiments of the present invention relate to a portable electronic device, and specifically, to a cover device of the portable electronic device, which is configured such that information on a display unit of the portable electronic device may be seen from the outside of the cover device. Simple functions may be accessed while the display unit of the portable electronic device is covered by the cover device.

Hereinafter, the description that "the screen of the display unit is exposed to the outside" does not mean that the display unit is exposed such that it can be directly contacted, but instead means that the information displayed on the display unit is visible from the outside while the display unit is covered by the cover device.

Hereinafter, a portable electronic device and a cover device thereof, according to embodiments of the present invention, will be described with reference to FIGS. 1A to 13. FIGS. 1A to 5 illustrate a cover device for a portable electronic device according to an embodiment of the present invention. FIGS. 6 to 9 illustrate another embodiment of the cover device of the portable electronic device. FIGS. 10 to 13 illustrate an additional embodiment of the cover device of the portable electronic device.

A body 100 of a portable electronic device 10 is configured to be interchangeably equipped with cover units 200a (FIG. 1A), 200b (FIG. 6A), and 200c (FIG. 10) according to embodiments of the present invention. A user environment may be set in the body 100 so that when any one of the cover units 200a, 200b, and 200c of the respective embodiments covers the body 100, the portable electronic device may recognized which of the cover units 200a, 200b, and 200c is coupled with the body. For this purpose, the body 100 is provided with a connection terminal set 130 that enables a user to identify which among the cover units 200a, 200b, and 200c is mounted on the body 100 of the portable electronic device 10.

Figure 1A:
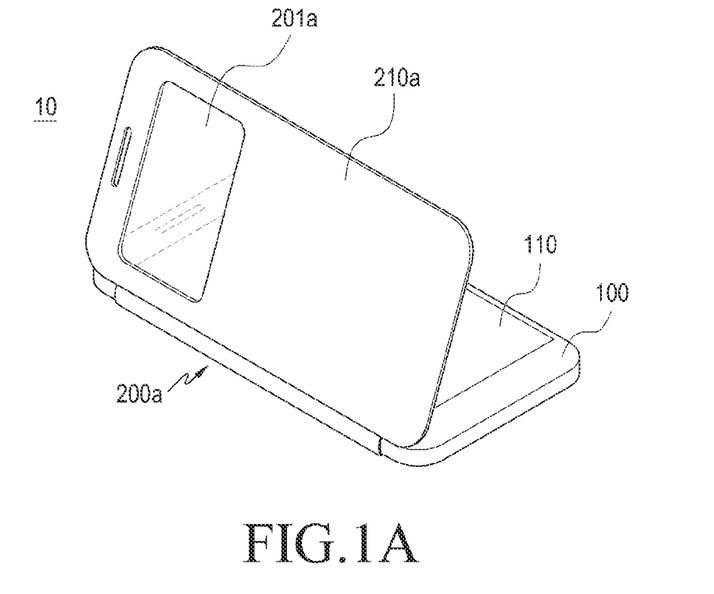
FIGS. 1A and 1B illustrate a portable electronic device and a cover device provided thereon, according to an embodiment of the present invention.
Figure 1B:
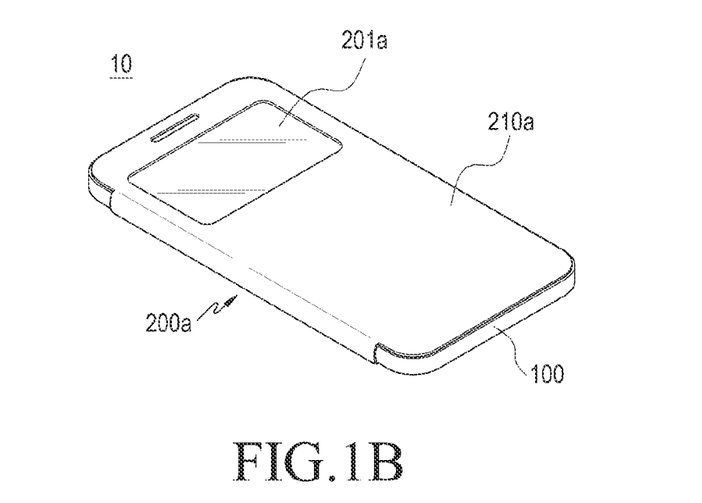

Hereinafter, descriptions of the cover unit 200a for the portable electronic device 10, according to an embodiment of the present invention will be made with reference to FIGS. 1 to 5. FIGS. 1A and 1B illustrates the portable electronic device 10 and the cover unit 200a provided thereon. Referring to FIGS. 1A and 1B, the portable electronic device 10 includes the body 100 and the cover unit 200a. The body 100 is provided with a display unit 110 that displays various functions or the like, on a front face thereof, and a battery 120 (see FIG. 3), or the like, that supplies power to the body 100, on a rear face. In addition, the body 100 is also provided with the connection terminal set 130 (see FIG. 3) on the rear face thereof in which the connection terminal set 130 is electrically connected with a rear cover part 220a (see FIG. 2), to be described in greater detail below. The cover unit 200a is provided to cover both the front and rear faces of the body 100. The cover unit 200a has a configuration in which, when the cover unit 200a covers the body 100, the screen of display unit 110 may be exposed to the outside. In this embodiment, the cover unit 200a and the body 100 are interconnected such that information such as time, characters, numbers, a caller's phone number, and a user environment, etc. (hereinafter, referred to as "information") may be displayed on the exposed screen. The rear cover part 220a may be provided as a battery cover to cover a battery 120 provided on the rear face of the body 100.

Figure 2:
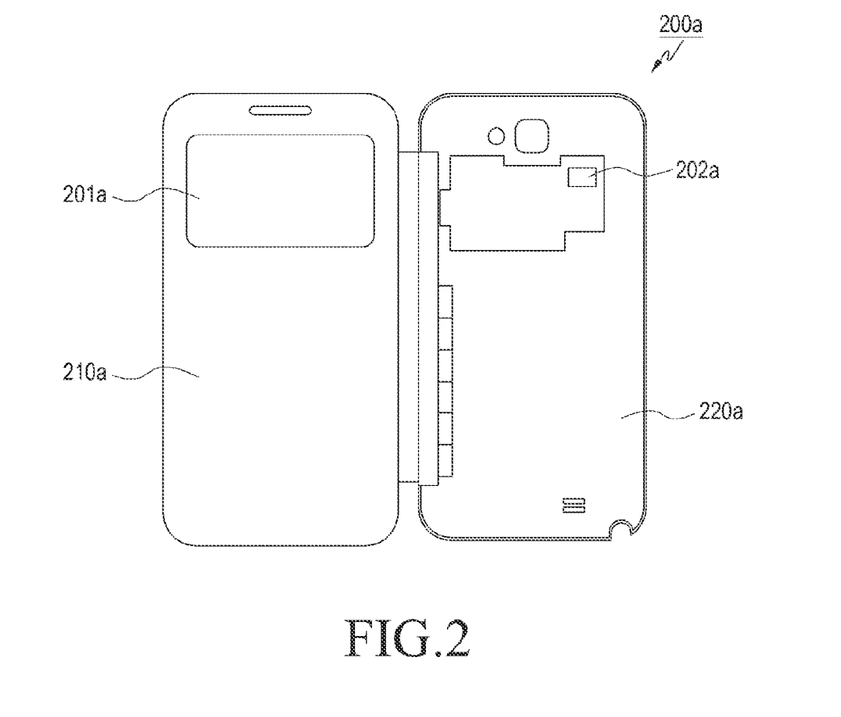
FIG. 2 illustrates a cover unit that covers the portable electronic device in FIGS. 1A and 1B, according to an embodiment of the present invention.
Figure 3:
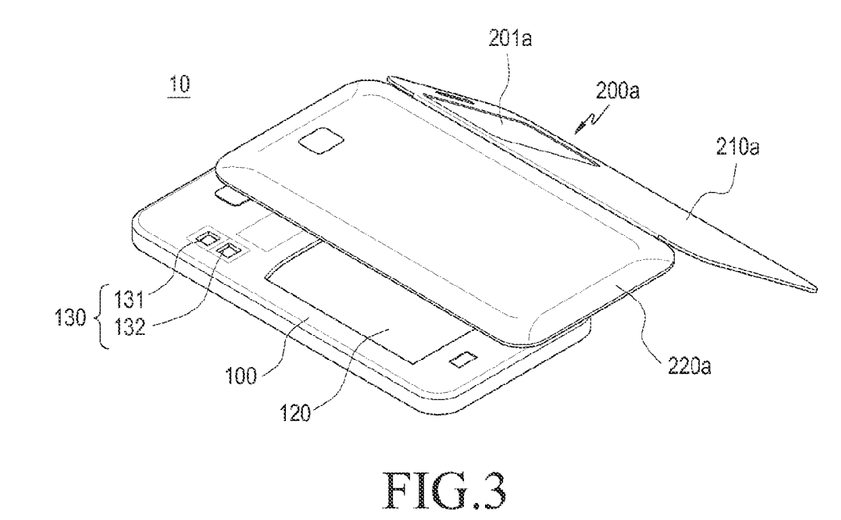
FIG. 3 illustrates the rear side of the portable electronic device and the cover device in FIGS. 1A and 1B, according to an embodiment of the present invention.

FIG. 2 illustrates the cover unit that covers the portable electronic device in FIGS. 1A, 1B and 3 illustrates the rear side of the portable electronic device and the cover device in FIG. 1. Referring to FIGS. 2 and 3, the cover unit 200a includes a front cover part 210a and a rear cover part 220a. The front cover part 210a covers the entire front face of the body 100 and is provided with a screen-viewing part 201a so that the screen of the front face of the display unit 110 may be exposed entirely or partly. The screen-viewing part 201a is provided to be transparent such that the display unit 110 may be visually seen while the front face of the display unit 110 is covered by the front cover part 210a. Therefore, the information displayed on the display unit 110, for example, weather, date and time, contents of a received message, a phone number, or a user environment, may be accessed through the screen-viewing part 201 a. This embodiment of the present invention assumes that the screen-viewing part 201 a is provided at an upper portion of the front cover part 210a, as an example. However, the screen-viewing part 201a is not limited thereto and may be provided at any position. For example, the screen-viewing part 201a may be provided at a central portion or a lower portion of the front cover part 210a. Alternatively, as will be described later, the screen-viewing part 201b may be provided at a side portion of the front cover part 210b, or as a front face of the front cover part 210c, as described in detail below.

Figure 4:
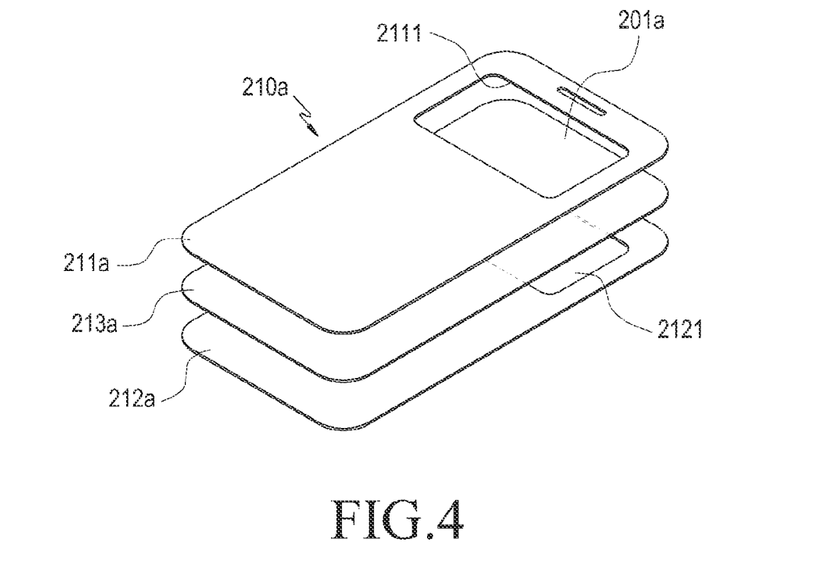
FIG. 4 illustrates the front cover part of the cover device in FIGS. 1A and 1B in a disassembled state, according to an embodiment of the present invention.

FIG. 4 illustrates the front cover part of FIGS. 1A and 1B in the disassembled state. Referring to FIG. 4, the front cover part 210a includes an outer member 211a, an inner member 212a, and a transparent member 213a, which form the screen-viewing part 201a, and cover and protect the display unit 110. The outer member 211a forms the outer face of the front cover part 210a and is formed of a somewhat elastic and hard material, such as polyurethane, so as to maintain a shape capable of covering the front face of the portable electronic device 10. The outer member 211a is formed with an outer hole 2111 so as to form the screen-viewing part 201a. The inner member 212a forms an inner face of the front cover part 210a and is coupled with the inner face of the transparent member 213a. The inner face of the inner member 212a is in direct contact with the display unit 110. Therefore, it is desirable that the inner member 212a is formed of a soft material, for example, a chamude material, so as to prevent damage such as scratches on the surface of the display unit 110. The inner member 212a is formed with an inner hole 2121 at a position corresponding to the outer hole 2111 so as to form the screen-viewing part 201a. The transparent member 213a is interposed between the outer member 211a and the inner member 212a. The transparent member 213a seals the outer hole 2111 and the inner hole 2121 and exposes a predetermined position of the display unit 110, specifically the upper portion of the display unit 110 in this embodiment of the present invention. That is, the screen-viewing part 201a is the portion of the transparent member 213a that is visible between the outer hole 2111 and the inner hole 2121. Thus, the screen-viewing part 201a is formed of the same material as the transparent member 213a—i.e. material such as a transparent plastic or the like. The screen-viewing part 201a allows the upper portion of the display unit 110 to be covered by the front cover part 210a but still be partially visible through the screen-viewing part 201a. In addition, the transparent member 213a may be formed to have a size which is larger than that of the screen-viewing part 201a so that the transparent member 213a may be joined between the outer member 211a and the inner member 212a while covering the screen-viewing part 201a, or to have a size which is the same as that of the cover unit 200a that covers the display unit 110. Thus, it is possible to form the transparent member 213a in any size as long as it allows the cover unit 200a to be seen from the outside at the position of the screen-viewing part 201a while sealing the outer hole 2111 and the inner hole 2121. The transparent member 213a may be made to contain a conductive material such as a conductive silicon. As a result, when the user touches the screen-viewing part 201a, the information of the display unit 110 may be accessed or executed. For example, when there is a phone call, the corresponding information is displayed on the display unit 110 at the position of the screen-viewing part 201a and the user may directly use a telephone function by touching the screen-viewing part 201 a or operating a side key or the like. In addition, as described below, when the cover unit 200a is mounted to wrap the body 100, a connector part 202a provided on the inner face of the rear cover part 220a is electrically connected to a connection terminal set 130 of the body 100 so that the information may be displayed within the size of the screen-viewing part 201a.

Referring back to FIGS. 2 and 3, a rear cover part 220a is fixed on and covers the rear face of the body 100. The front cover part 210a is connected to a face of the rear cover part 220a. In general, the rear cover part 220a has a shape which allows it to bend to wrap the side faces of the body 100 so that the side faces of the body 100 are engaged with the inner face of the rear cover part 220a without being released therefrom. The rear cover part 220a is provided with the connector part 202a which is adapted to be engaged with and electrically connected to the connection terminal set 130 provided on the rear face of the body 100. The connection terminal set 130, including a plurality of connection terminals 131 and 132, is provided on the rear face of the body 100. The connector part 202a is engaged with and electrically connected to at least one of the plurality of connection terminals 131 and 132. As a result, depending on the connection terminal set 130 where the connector part 202a is engaged, the information displayed on the display unit 110 is set to correspond to the size and location of the screen-viewing part 201a of the cover unit 200a coupled to the body 100. In addition, the rear cover part 220a may be provided in the shape of a cover that covers the body 100, more specifically in the shape of a rear case (hereinafter, referred to as a "battery cover") that covers the battery 120. Alternatively, the rear cover part 220a may replace the rear case, i.e. may be formed as the actual battery cover. The foregoing embodiment of the present invention, provides an example in which the rear cover part 220a is formed as a battery cover so that it may also have a function of the rear case of the body. However, as described above, the cover part 220a is not limited thereto and may be modified in various ways.

Figure 5:
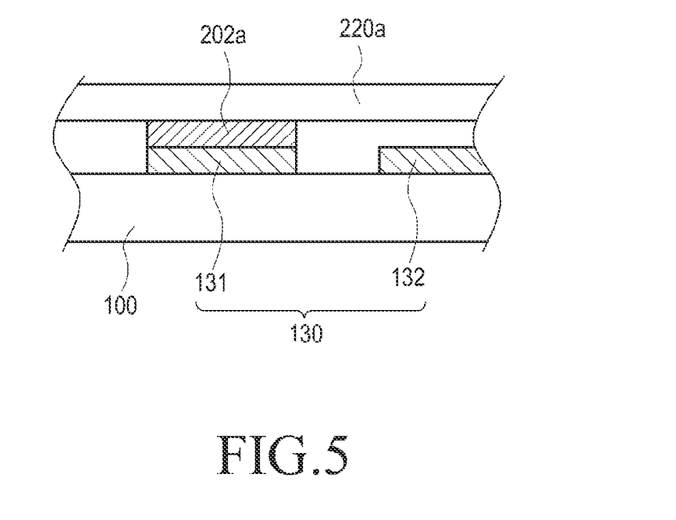
FIG. 5 illustrates a state in which the connector part and the first connection terminal are electrically connected with each other when the rear cover part is covered on the rear face of the portable electronic device in FIG. 3, according to an embodiment of the present invention.

FIG. 5 illustrates a state where the connector part and the first connection terminal are electrically connected with each other when the rear cover part is covered on the rear face of the portable electronic device of FIG. 3. Referring to FIG. 5, the connection terminal set 130, including the first connection terminal 131 and the second connection terminal 132, is provided on the rear face of the body 100 (see also FIG. 3), and the connector part 202a is positioned on the inner face of the rear cover part 220a at a position where the connector part 202a is engaged with one of the first connection terminal 131 and the second connection terminal 132 (in an embodiment to be described below, it will be shown that the first connection terminal 131 and the connector part 202a are connected with each other). Thus, when the rear cover part 220a is fixed while covering the rear face of the body 100, the connector part 202a provided on the inner face of the rear cover part 220a is electrically connected with the first connection terminal 131. When the connector part 202a is connected with the first connection terminal 131, the cover unit 200a covers the body 100 and the screen-viewing part 201a provided on the front cover part 210a is positioned over the display unit 110. As a result, the display unit 110 is activated so that information may be displayed on the display unit 110 at the position where the display unit 110 is visible through the screen-viewing part 201a.

The connection terminal set 130 includes two connection terminals, i.e. the first connection terminal 131 and the second connection terminal 132, so that, when the connection terminal set 130 is engaged with the cover unit 200a, 200b, or 200c of each of the illustrated embodiments, information may be displayed on the display unit 110 in a manner suitable for the shape of the screen-viewing part 201a, 201b, or 201c. That is, as described below, when a connector part 202b is engaged with the second connection terminal 132, as in FIG. 9, it is shown that a screen-viewing part 201b is positioned at a side portion of a front cover part 210b and the information is displayed through the portion of the display unit 110 corresponding to the side portion of the front cover part 210b (see FIGS. 6A and 6B), or when a connector part 202c is connected with both the first connection terminal 131 and the second connection terminal 132, as in FIG. 13, it is shown that a screen-viewing part 201c is positioned over the entire front face of a front cover part 210c and the information may be displayed through the entire front face of the display unit 110. However, the configurations for the engagement of the connection terminal set 130 and the connector parts 202a, 202b, 202c and for the determination of the positioning of the display information on the display unit 110, are not limited to those described above. Such configurations may be modified depending on the types of the cover units 200a, 200b, and 200c, the types of the screen-viewing parts 201a, 201b, and 201c, or the number of cover units which may be mounted on the body 100. For example, when three connection terminals are provided, seven types of cover units which have different types of screen-viewing parts may be mounted on the body 100. Therefore, the display unit may be configured to display information to be suitable for each of the seven different types of the screen-viewing parts.

Therefore, when the cover unit 200a includes the screen-viewing part 201a provided at the upper portion of the front cover part 210a, and the connector part 202a provided on the inner face of the rear cover part 220a at the position where the connector part 202a is engaged with the first connection terminal 131, the body 100 is covered in a manner where the upper portion of the display unit 110 may be visible. As a result, the user may see information through the screen-viewing part 201a, for example, time, a text message, a phone call, etc. according to a defined user environment. Further, when the cover unit 200a and the body 100 are electrically connected, the body 100 may recognize the type of the screen-viewing part 201a so that information may be displayed at a position on the display unit 110 which is suitable for the screen-viewing part 201a.

Figure 6A:
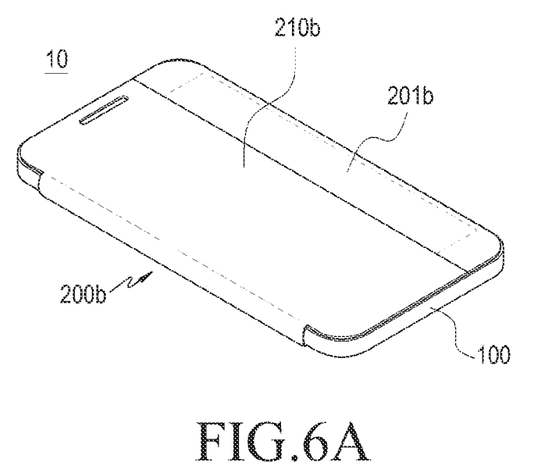
FIGS. 6A and 6B illustrate a portable electronic device and a cover device provided thereon, according to an embodiment of the present invention.
Figure 6B:
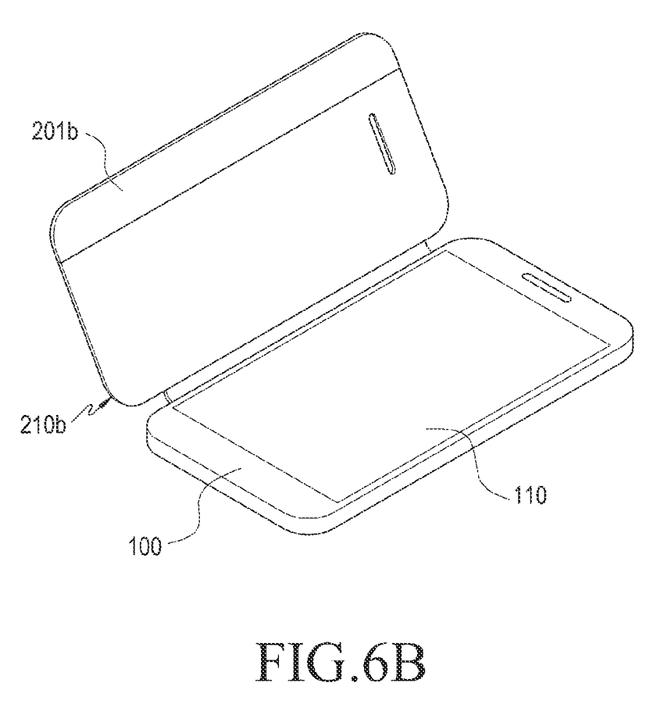
Figure 7:
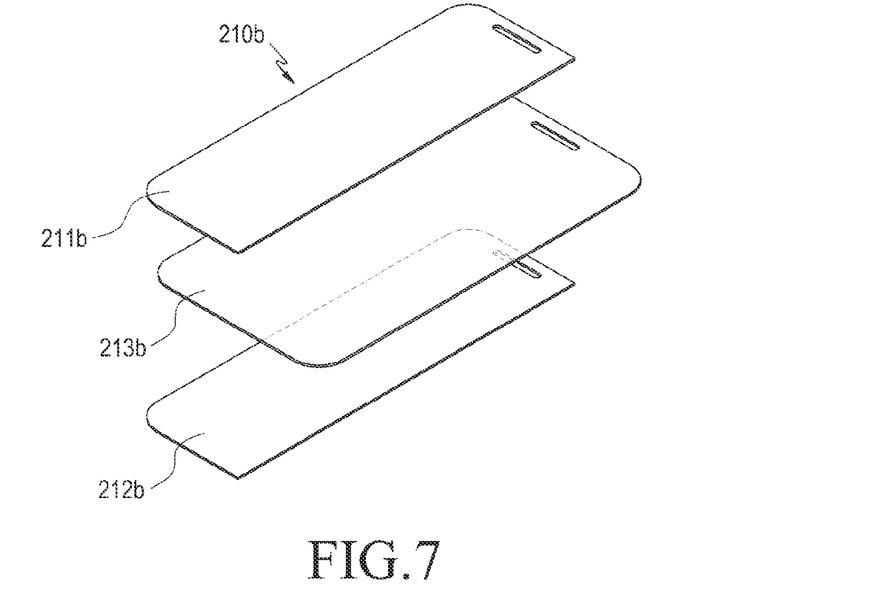
FIG. 7 illustrates the front cover part of the cover device in FIGS. 6A and 6Ba in the disassembled state, according to an embodiment of the present invention.

Hereinafter, a portable electronic device and a cover device thereof according to another embodiment of the present invention will be described with reference to FIGS. 6A to 9. The cover unit 200b is different from the cover unit 200a in that the screen-viewing part 201b is formed differently. Thus, the connection terminal set 130 of the body 100 is located at a different position. FIGS. 6A and 6B illustrates a cover device according to another embodiment of the present invention and a portable electronic device having the same. FIG. 7 illustrates the front cover part in FIGS. 6A and 6B. Referring to FIGS. 6A and 6B and 7, the portable electronic device 10 includes the body 100 and the cover unit 200b as in the first embodiment. As described above, this embodiment differs in view of the type of the screen-viewing part 201b of the front cover part 210b, the position of the connector part 202b, and the connection terminal set 130 to be connected with connector part 202b. That is, the cover unit 200b of the second embodiment, specifically, the screen-viewing part 201b is provided at a side portion of the front cover part 210b, specifically, at the right portion of the display unit 110. Thus, the right portion of the display unit 110 is exposed to the outside while being covered by the screen-viewing part 201b and the information is displayed at the right portion of the display unit 110. Thus, the user may see the information displayed at the right portion of the display unit 110. As in the first embodiment, the front cover part 210b includes an outer member 211b, an inner member 212b, and a transparent member 213b. In the present embodiment, the transparent member 213b is formed in a size corresponding to the entire front face of the body 100. The outer member 211b and the inner member 212b, attached to the outer face and inner face, respectively, of the transparent member 213b, are formed to have a width shorter than that of the transparent member 213b. As a result, at the right portion of the front cover part 210b, i.e. at the screen-viewing part 201b, the transparent member 213b is positioned so that the right portion of the display unit 110 may be exposed to the outside while being covered by the transparent member 213b. However, the screen-viewing part 201b is not necessarily provided at the right portion of the front cover part 210b. For example, the screen-viewing part 201b may be provided at the left portion or at the central portion and the shape of the screen-viewing part 201b may be changed in various ways.

Figure 8:
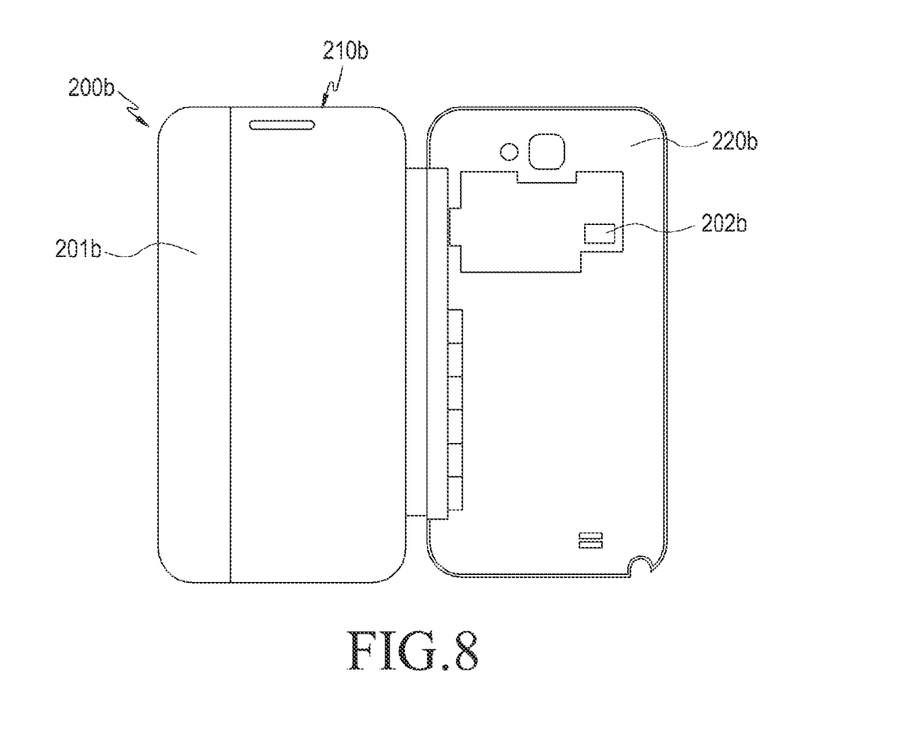
FIG. 8 illustrates the cover unit that covers the portable electronic device in FIGS. 6A and 6B, according to an embodiment of the present invention.
Figure 9:
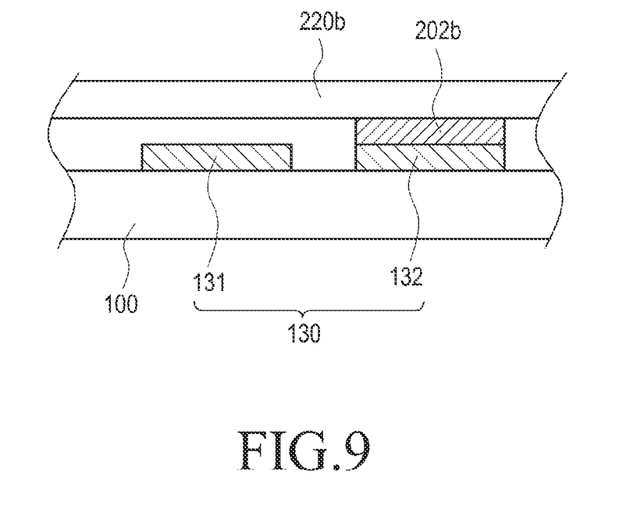
FIG. 9 illustrates the connected state between the connection terminal set provided on the rear face of the body in FIGS. 6A and 6B and the connector part of the rear cover part, according to an embodiment of the present invention.

FIG. 8 illustrates the cover unit illustrated in FIGS. 6A and 6B. FIG. 9 illustrates the connected state between the connection terminal set 130 provided on the rear face of the body 100 of FIG. 6 and the connector part of the rear cover part. Referring to FIGS. 8 and 9, the connection terminal set 130, which includes two connection terminals, i.e. the first connection terminal 131 and the second connection terminal 132, are formed on the rear face of the body 100 to be adjacent to each other and a connector part 202b electrically connected with the second connection terminal 132 is provided on the inner face of the rear cover part 220b to be opposite to the position of the second connection terminal 132. Therefore, when the rear cover part 220b is fixed to cover the rear face of the body 100, the connector part 202b provided on the inner face of the rear cover part 220b is electrically connected with the second connection terminal 132. When the connector part 202b is connected with the second connection terminal 132, it is recognized that the cover unit 200b covers the body 100 and the screen-viewing part 201b provided in the cover unit 200b, specifically, at the front cover part 210b is positioned at the right side portion of the cover unit 200b. Then, the display unit 110 is activated such that information is displayed on the display unit 110 at a position where the screen-viewing part 201b is positioned, specifically, at the right portion of the display unit 110. As a result, even if the cover unit 200b covers the body 100, the information displayed at the right portion of the display unit 110 may be seen through the screen-viewing part 201b at the right portion of the front cover part 210b.

Hereinafter, a portable electronic device and a cover device thereof, according to an additional embodiment of the present invention, will be described with reference to FIGS. 10 to 13. The cover unit 200c of the third embodiment is different from the cover units 200a and 200b in that a screen-viewing part 201c is formed in a different manner and thus, the connection terminal set 130 of the body 100 is provided at a different position. That is, the cover unit 200a is configured such that the screen-viewing part 201a is provided at the upper portion of the front cover part 210a and the connector part 202a is connected to the first connection terminal 131. The cover unit 200b is configured such that the screen-viewing part 201b is provided at the right portion of the front cover part 210b and the connector part 202b is connected to the second connection terminal 132. However, the cover unit 200c is configured such that the screen-viewing part 201c is formed as a front face of the front cover part 210c so that the display unit 110 is entirely exposed to the outside while being covered by the screen-viewing part 201c. The cover unit 200c is provided with first and second connector parts 2021 and 2022 connected to the first and second connection terminals 131 and 132 such that the body 100 may recognize that the cover unit 200c exposes the display unit 110 in its entirety and information may thus be displayed on the entire front face of the display unit 110.

Figure 10:
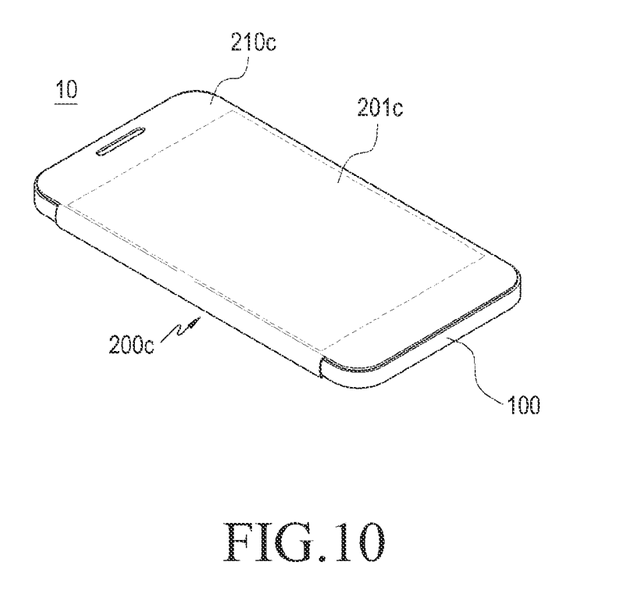
FIG. 10 illustrates a cover device of a portable electronic device, according to an embodiment of the present invention.
Figure 11:
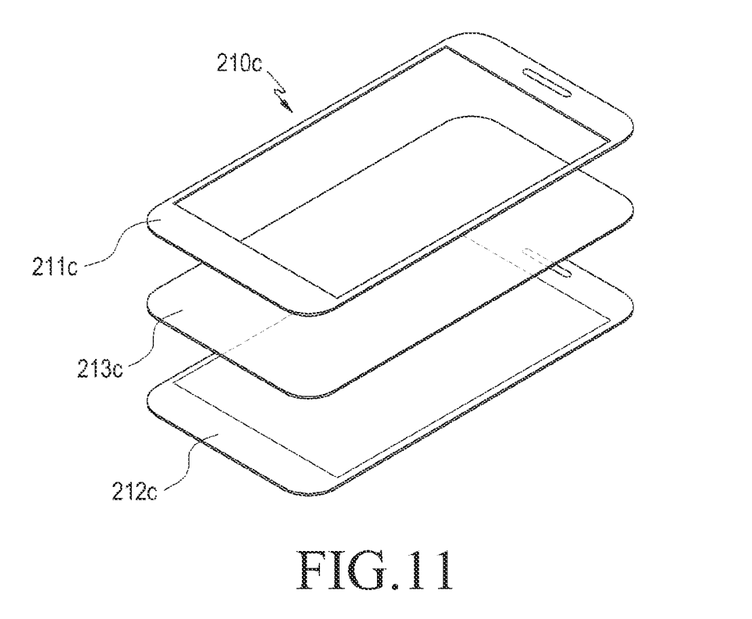
FIG. 11 illustrates the front cover part of the cover device in FIG. 10 in a disassembled state, according to an embodiment of the present invention.

Specifically, FIG. 10 illustrates a state where the portable electronic device is provided with the cover device. FIG. 11 illustrates the front cover part illustrated in FIG. 10. Referring to FIGS. 10 and 11, the portable electronic device 10 includes the body 100 and the cover unit 200c. As described above, the type of the screen-viewing part 201c of the front cover part 210c, the position of the connector part 202c, and the connection terminal set 130 to be connected with connector part 202c differentiates this embodiment of the present invention. That is, the screen-viewing part 201c of the cover unit 200c of the third embodiment covers the entire front face of the body 100, specifically, the entire front face of the display unit 110 such that the display unit 110 is entirely exposed to the outside.

Thus, the user may see the information displayed on the entire face of the display unit 110 through the screen-viewing part 201c that transparently covers the entire face of the display unit 110. The front cover part 210c includes an outer member 211c, an inner member 212c, and a transparent member 213c. The outer member 211c and the inner member 212c are preferably formed only at the peripheral edges of the transparent member 213c. The transparent member 213c is formed in a size corresponding to the entire front face of the body 100. The outer member 211c and the inner member 212c are attached on the outer and inner faces of the transparent member 213c only along the peripheral sides of the transparent member 213c. Thus, the screen-viewing part 201c in the front cover part 210c has a size corresponding to the entire front face of the body 100 or the entire front face of the display unit 110 so that the display unit 110 may be entirely exposed to the outside while being covered by the transparent member 213c.

Figure 12:
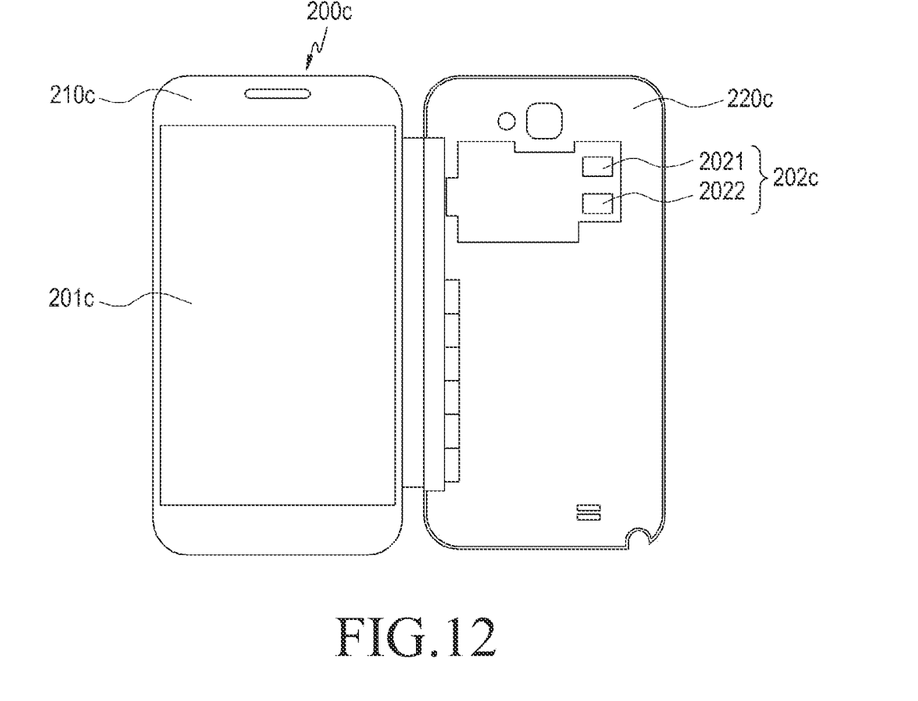
FIG. 12 illustrates the cover unit in FIG. 10, according to an embodiment of the present invention.
Figure 13:
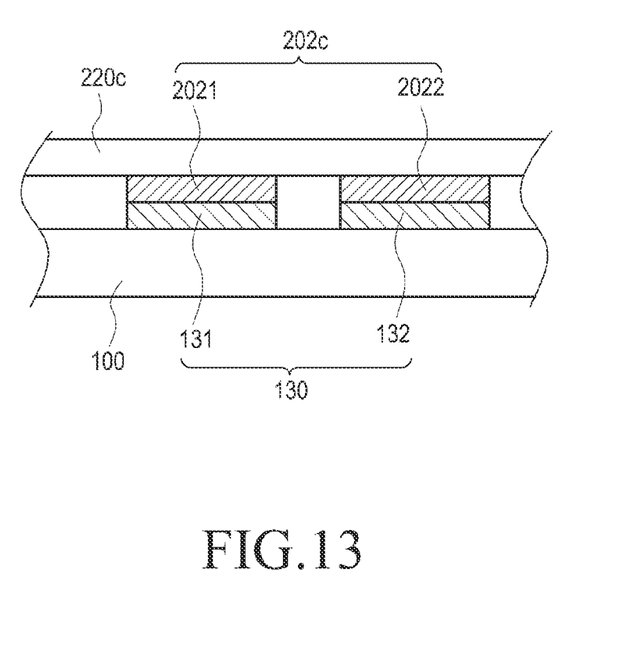
FIG. 13 illustrates the connected state between the connection terminal set provided on the rear face of the body of the portable electronic device in FIG. 10 and the connector parts of the rear cover part of the cover device, according to an embodiment of the present invention.

FIG. 12 illustrates the cover unit illustrated in FIGS. 10 and 13 illustrate a connected state between the connection terminal set provided on the rear face of the body illustrated in FIG. 10 and the connector parts of the rear cover part. Referring to FIGS. 12 and 13, the connection terminal set 130, which includes two connection terminals, i.e. the first connection terminal 131 and the second connection terminal 132, is formed on the rear face of the body 100 so that the connection terminals be adjacent to each other. This allows the first connector part 2021 and the second connector part 2022 to be electrically connected with the first connection terminal 131 and the second connection terminal 132 which are provided on the inner face of the rear cover part 220b, opposite the positions of the first and second connection terminals 131 and 132, respectively. Thus, when the rear cover part 220c is fixed to cover the rear face of the body 100, the first connector part 2021 and the second connector part 2022 provided on the inner face of the rear cover part 220c are connected with the first connection terminal 131 and the second connection terminal 132, respectively. As a result, it is shown that the cover unit 200c including the screen-viewing part 201 c that covers the entire front face of the body 100 while exposing the entire front face of the display unit 110 is attached, and the information displayed on the entire front face of the display unit 110 may be seen through the screen-viewing part 201c.

In the above-described embodiments, as examples, it has been described that three types of cover units 200a, 200b, and 200c each of which includes a screen-viewing part 201a, 201b or 201c are provided on the body 100. However, the type or shape of the cover units 200a, 200b, and 200c are not limited to the embodiments and may have various shapes according to a design or a user environment. In addition, the cover units 200a, 200b, and 200c may be modified as long as the portable electronic device 10 has a configuration in which the portable electronic device 10 may be set such that information may be displayed on the display unit 110 in a manner suitable for various screen-viewing parts 201a, 201b, and 201c.

The cover devices of a portable electronic device configured as described above are advantageous in that they may cover the portable electronic device entirely so as to prevent scratches or damage. In addition, there is an advantage in that the information displayed on a display unit may be seen while the cover unit remains covering the display. Further, since the front cover part that covers the display unit need not be frequently opened and closed, the potential for damage of the cover unit may be reduced, thereby increasing the lifespan of the cover unit. Further, the invention offers users added convenience since the display unit of a portable electronic device may be activated such that the information displayed on the display unit may be exposed to the outside to be suitable for various types of screen-viewing parts according to the type of a cover unit attached to the portable electronic device.

While the present invention has been shown and described with reference to certain embodiments thereof, it will be understood by those skilled in the art that various changes in form and details may be made therein without departing from the spirit and scope of the present invention as defined by the appended claims.

What is claimed is:

1. A cover device for a portable electronic device comprising:
   a front cover part configured to cover a display unit provided on a first surface of the portable electronic device and comprising a screen-viewing part exposing a portion of a screen of the display unit, and
   a rear cover part configured to be connected to the front cover part and cover a second surface, opposed to the first surface, of the portable electronic device and comprising at least one connector part to be connected with at least one connection terminal of connection terminals on the second surface of the portable electronic device,
   wherein the at least one connector part is for identifying, by the portable electronic device, a position of the screen-viewing part, when the at least one connector part is connected with the at least one connection terminal.

2. The cover device of claim 1, wherein the screen-viewing part exposes an upper portion of the screen of the display unit.

3. The cover device of claim 1, wherein the screen-viewing part exposes a left portion or a right portion of the screen of the display unit.

4. The cover device of claim 1, wherein the portion of the screen exposed is the entire screen of the display unit.

5. The cover device of claim 1, wherein the front cover part comprises:
   an outer member that forms an outer face of the front cover part, the outer member being formed with an outer hole at a position of the screen-viewing part;
   an inner member that forms an inner face of the front cover part and comes in contact with the display unit, the inner member being formed with an inner hole having a position that corresponds with the outer hole; and
   a transparent member interposed between the outer member and the inner member to seal the outer hole and the inner hole and expose the portion of the screen.

6. The cover device of claim 5, wherein the outer member is made of a polyurethane material, the inner member is made of a chamude material, and the transparent member is made of a transparent plastic.

7. The cover device of claim 5, wherein the transparent member contains a conductive silicon.

8. The cover device of claim 1, wherein
a plurality of connector parts are provided on an inner face of the rear cover part corresponding to positions of the connection terminals.

9. The cover device of claim 8, wherein the connection terminals comprise:
a first connection terminal provided at a side portion of the second surface of a body of the portable electronic device; and
a second connection terminal provided adjacent to the first connection terminal.

10. The cover device of claim 9, wherein one of the connector parts corresponds to a position of the first connection terminal.

11. The cover device of claim 9, wherein one of the connector parts corresponds to a position of the second connection.

12. The cover device of claim 9, wherein the connector parts comprise:
a first connector part that is provided on the inner face of the rear cover part corresponding to the position of the first connection terminal; and
a second connector part that is provided adjacent to the first connector part corresponding to the position of the second connection terminal.

13. The cover device of claim 1, wherein the rear cover part covers a battery of the portable electronic device.

14. A portable electronic device comprising:
a body that includes a display unit on a front face, and a connection terminal set on a rear face;
a battery cover that covers the rear face of the body; and
a front cover part connected to the battery cover to cover the display unit, the front cover part being provided with a screen-viewing part that exposes a portion of a screen of the display unit,
wherein, when the display unit is covered by the front cover, the display unit displays information on the screen only at a position corresponding to the screen-viewing part,
wherein the connection terminal set is provided on the rear face of the body,
wherein a connector part that is electrically connected with the connection terminal set is provided inside the battery cover, and wherein the connection terminal set comprises:
a first connection terminal provided at a side portion of the rear face of the body, and
a second connection terminal provided adjacent to the first connection terminal, and
wherein the screen-viewing part is provided at an upper portion of the front cover part to expose an upper portion of the display unit, and the connector part is connected with the first connection terminal so that information is displayed at the upper portion of the display unit, when the display unit is covered.

15. The portable electronic device of claim 14, wherein the screen-viewing part is provided at a left portion or a right portion of the front cover part to expose a left portion or a right portion of the display unit, and the connector part is connected with the second connection terminal so that information is displayed at the left portion or the right portion of the display unit, when the display unit is covered.

16. The portable electronic device of claim 14, wherein the screen-viewing part is transparent and is provided as a front face of the front cover part to expose an entire front face of the display unit, and the connector part is connected with the first connection terminal and the second connection terminal so that information is displayed on an entire front face of the display unit.

17. The portable electronic device of claim 14, wherein the front cover part comprises:
an outer member that forms an outer face of the front cover part, the outer member being made of a polyurethane material;
an inner member that forms an inner face of the front cover part, the inner member being made of a chamude material; and
a transparent member interposed between the outer member and the inner member to expose the display unit.

18. The portable electronic device of claim 17, wherein the transparent member contains a conductive silicon.

* * * * *